United States Patent [19]

Ball

[11] Patent Number: 5,689,135
[45] Date of Patent: Nov. 18, 1997

[54] MULTI-CHIP DEVICE AND METHOD OF FABRICATION EMPLOYING LEADS OVER AND UNDER PROCESSES

[75] Inventor: Michael B. Ball, Boise, Id.

[73] Assignee: Micron Technology, Inc., Boise, Id.

[21] Appl. No.: 574,994

[22] Filed: Dec. 19, 1995

[51] Int. Cl.⁶ .......................... H01L 23/495; H01L 23/34
[52] U.S. Cl. .......................... 257/676; 257/690; 257/724; 437/207; 437/220
[58] Field of Search .......................... 257/666, 723, 257/724, 676, 690; 437/206, 207, 220

[56] References Cited

U.S. PATENT DOCUMENTS

| | | | |
|---|---|---|---|
| 4,862,245 | 8/1989 | Pasnby et al. | 357/70 |
| 5,012,323 | 4/1991 | Farnworth | 257/723 |
| 5,101,324 | 3/1992 | Sato | 257/723 |
| 5,291,061 | 3/1994 | Ball | 257/686 |
| 5,438,224 | 8/1995 | Papageorge et al. | 257/723 |
| 5,463,253 | 10/1995 | Waki et al. | 257/724 |
| 5,471,369 | 11/1995 | Honda et al. | 257/723 |
| 5,479,051 | 12/1995 | Waki et al. | 257/724 |
| 5,523,608 | 6/1996 | Kitaoka et al. | 257/723 |
| 5,539,250 | 7/1996 | Kitano et al. | 257/723 |
| 5,579,208 | 11/1996 | Honda et al. | 257/778 |

FOREIGN PATENT DOCUMENTS

| | | | |
|---|---|---|---|
| 62351 | 5/1981 | Japan | 257/666 |
| 164257 | 7/1986 | Japan | 257/666 |
| 220837 | 9/1989 | Japan | 257/666 |
| 272144 | 10/1989 | Japan | 257/666 |
| 155954 | 5/1992 | Japan | 257/666 |

*Primary Examiner*—Tom Thomas
*Assistant Examiner*—David Ostrowski
*Attorney, Agent, or Firm*—Trask, Britt & Rossa

[57] ABSTRACT

A device and method for increasing integrated circuit density comprising a pair of superimposed dies with a plurality of leads extending between the dies. The device is produced by providing a lower die which has a plurality of bond pads on a face side of the lower die. A layer of dielectric or insulative shielding is applied over the lower die face side. Leads are applied to an upper surface of the shielding layer. A plurality of lower die bond wires is attached between the lower die bond pads and an upper surface of their respective leads. A second layer of dielectric or insulative shielding is applied over the leads and the portion of the lower die bond wires extending over the lead upper surfaces. A back side of the upper die is adhered to an upper surface of the second shielding layer. A plurality of upper die bond wires are attached between a plurality of bond pads on a face side of the upper die and the upper surface of their respective leads.

21 Claims, 3 Drawing Sheets

MULTI-CHIP DEVICE AND METHOD OF FABRICATION EMPLOYING LEADS OVER AND UNDER PROCESSES

BACKGROUND OF THE INVENTION

1. Field of the Invention

The present invention relates to an improved semiconductor device and method for increasing semiconductor device density. In particular, the present invention relates to a device and method utilizing leads over and under processes such that two superimposed semiconductor dice can be attached to a single lead frame.

2. Background Art

High performance, low cost, increased miniaturization of components, and greater packaging density of integrated circuits have long been the goals of the computer industry. Greater integrated circuit package density, for a given level of component and internal conductor density, is primarily limited by the space available for die mounting and packaging. For lead frame mounted dies, this limitation is a result of conventional lead frame design. Conventional lead frame design inherently limits potential single-die package density because the die-attach paddle of the lead frame must be as large as or larger than the die securing it. The larger the die, the less space (relative to size of the die) that remains around the periphery of the die-attach paddle for bond pads for wire bonding. Furthermore, the inner lead ends on a lead frame provide anchor points for the leads when the leads and the die are encapsulated in plastic. The anchor points may be emphasized as lateral flanges or bends or kinks in the lead. Therefore, as the die size is increased in relation to the package size, there is a corresponding reduction in the space along the sides of the package for the encapsulating plastic which joins the top and bottom portions of the molded plastic body at the mold part line and anchors to the leads. As the leads are subjected to the normal stresses of forming and assembly operations, the encapsulating plastic may crack, which may destroy the package seal and substantially increase the probability of premature device failure.

One method of increasing integrated circuit density is to stack dice vertically. U.S. Pat. No. 5,012,325 ("the '323 patent") issued Apr. 30, 1991 to Farnworth teaches combining a pair of dice mounted on opposing sides of a lead frame. An upper die is back-bonded to the upper surface of the leads of the lead frame via a first adhesively coated, insulated film layer. The lower die is face-bonded to the lower lead frame die-bonding region via a second, adhesively mated, insulative film layer. The wire-bonding pads on both the upper die and lower die are interconnected with the ends of their associated lead extensions with gold or aluminum wires. The lower die needs to be slightly larger than the upper die in order that the lower die bonding pads are accessible from above through an aperture in the lead frame such that gold wire connections can be made to the lead extensions. However, this arrangement has a major disadvantage from a production standpoint, since the different size dice require that different equipment produce the different dice or that the same equipment be switched over in different production runs to produce the different dice. Moreover, the lead frame design employed by Farnworth employs long conductor runs between the die and the exterior of the package, and the lead frame configuration is specialized and rather complex.

U.S. Pat. No. 5,291,061 issued Mar. 1, 1994 to Ball teaches a multiple stacked die device that contains up to four dies which does not exceed the height of current single die packages. The low profile of the device is achieved by close-tolerance stacking which is made possible by a low-loop-profile wirebonding operation and thin-adhesive layers between the stack dies. However, Ball secures all of the dice to the same (upper) side of the lead frame, necessarily increasing bond wire length, even if some of the leads are bent upwardly. Moreover, Ball employs a die paddle to support the die stack, a technique which requires an extra die-attach step, and which increases the distance between the inner lead ends and even the lowermost die in the stack, resulting in longer bond wires.

U.S. Pat. No. 4,862,245 issued Aug. 29, 1989 to Pashby discloses a "leads over chip" (LOC) configuration, wherein the inner lead ends of a standard dual-in-line package (DIP) lead frame configuration extend over and are secured to the upper (active) surface of the die through a dielectric layer. The bond wire length is thus shortened by placing the inner lead ends in closer proximity to a central row of die bond pads, and the lead extensions purportedly enhance heat transfer from the die. However, the Pashby LOC configuration as disclosed relates to mounting and bonding only a single die.

Therefore, it would be advantageous to develop a technique and device for increasing integrated circuit density using substantially similar or identically sized dies with non-complex lead frame configurations, provide short bond wire lengths and achieve a lower profile than state-of-the-art designs, which configuration is readily susceptible to plastic packaging techniques, such as transfer molding.

SUMMARY OF THE INVENTION

The present invention relates to a device and method for increasing integrated circuit density. The device comprises a pair of superimposed dies with a plurality of leads disposed between the dies. The device is produced by providing a lower die which has a plurality of bond pads on a face side or active surface of the lower die. A layer of dielectric shielding such as a polyimide is applied over the lower die face side without coveting the lower die bond pads. Leads are secured to an upper surface of the shielding layer. The lower die-to-leads connection is thus the previously referenced LOC configuration.

A plurality of lower die bond wires are then attached between the lower die bond pads and an upper surface of their associated, respective leads in an LOG chip wirebonding process. In wirebonding, gold or aluminum bond wires are attached, one at a time, from each bond pad on the die and to a corresponding lead. The bond wires are generally attached through one of three industry standard wirebonding techniques: ultrasonic bonding—using a combination of pressure and ultrasonic vibration bursts to form a metallurgical cold weld; thermocompression bonding—using a combination of pressure and elevated temperature to form a weld; and thermosonic bonding—using a combination of pressure, elevated temperature, and ultrasonic vibration bursts.

Once the lower die bond wires are attached, a second layer of shielding is applied over the leads and the portion of the lower die bond wires which extends over the lead upper surfaces. A back side of the upper die is adhered to an upper surface of the second shielding layer in a "leads under chip" (LUC) die-attach. A plurality of upper die bond wires are attached between a plurality of bond pads on a face side or active surface of the upper die and the upper surface of their associated, respective leads in a LUC wirebonding process.

Alternately, the lower die bond wires can be attached with a more vertical arrangement such that only a small portion of each of the lower die bond wires extends over the lead upper surfaces. Alternately, the lower bond wires can be attached to the lead upper surface in a direction extending away from the assembly. With either arrangement, the lower die bond wires will not cause electrical interference with the operation of the upper die, thus no second shielding layer is needed to cover the portion of the lower die bond wires which extends over the lead upper surfaces.

Generally, the device has leads with inner ends of substantially the same length to which the dies are attached as discussed above. However, the device can be constructed with lead-ends of differing lengths. The differing lead-end length arrangement can consist of a plurality of long leads with an alternating plurality of short leads. The long leads extend between the upper die and lower die and may be connected to the lower bond pads by the lower bond wires. The short leads, which preferably do not extend between the upper die and lower die, are connected to the upper bond pads by the upper die bond wires. This arrangement assists in reducing the potential for bond wire to lead shorting.

Preferably, the upper and lower dies are identical, such as a pair of 2 Meg VRAMs. Thus, the above discussed arrangement would achieve a 4 Meg VRAM, yielding more memory in a low-profile, small package with a smaller lead pitch. Alternately, 8 MEG memory may be achieved by using two 4 MEG DRAMS while 32 MEG memory may be achieved by using two 16 MEG DRAMS. However, the upper and lower dies do not have to be identical in size. Furthermore, the dies can have differing bond pad arrangements. For example, the lower die may have a plurality of lower bond pads in a row in approximately the middle of the face side of the lower die. Such a device is constructed by applying two parallel layers of shielding adhesive over the lower die face side on either side of the row of lower bond pads. The leads are adhered to the upper surfaces of the shielding layer. The plurality of lower die bond wires are attached between the lower die bond pads and the upper surface of their respective leads.

Once the lower bond wires are attached, a second set of parallel layers of shielding is applied over the leads. The lower die bond wires may or may not be covered with the second shielding layer. The back of the upper die is adhered to the upper surfaces of the second shielding layer. The plurality of upper die bond wires is attached between the plurality of bond pads on a face side of the upper die and the upper surface of their associated, respective leads.

If the lower bond wires are not covered with the second shielding layer, a conformal coating or potting compound may be applied over and around the lower bond wires. Alternately, the encapsulation material used to encapsulate the bare die assembly may be permitted to flow around the lower die bond wires.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings, in which:

DETAILED DESCRIPTION OF THE PREFERRED EMBODIMENTS

Figure 1:
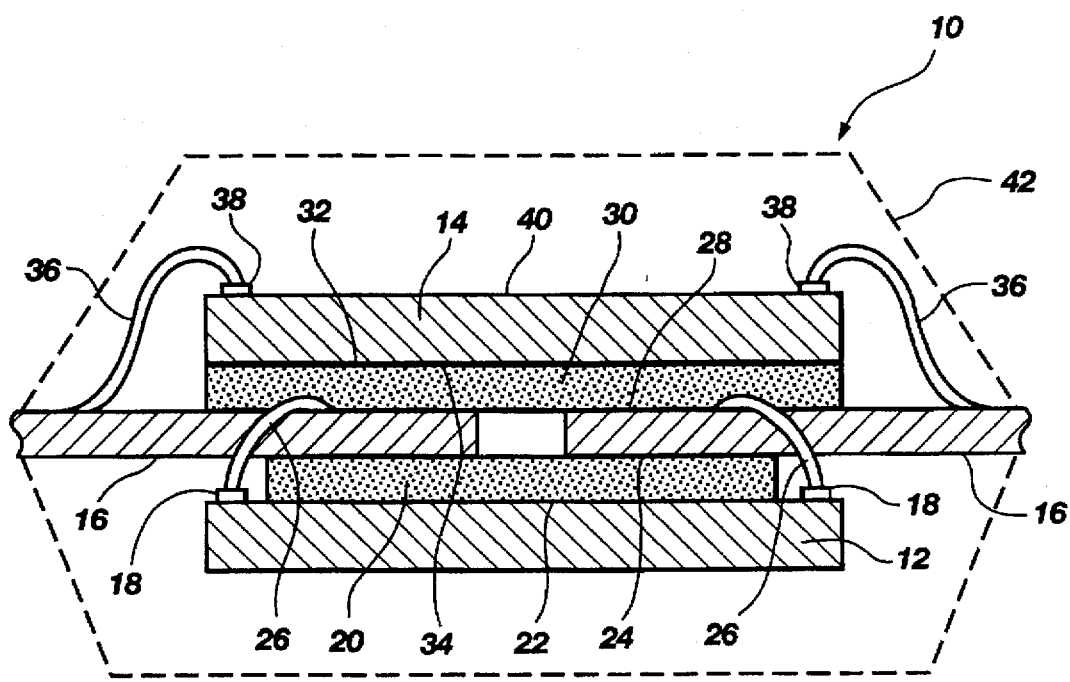
FIG. 1 is a side cross-sectional view of one preferred assembly of the present invention.

FIG. 1 illustrates a preferred bare multiple-die assembly 10 of the present invention. The assembly 10 comprises a lower semiconductor die 12 and an opposing upper semiconductor die 14 with a plurality of leads 16 (usually of a lead frame as known in the art) disposed therebetween. Fabrication of the assembly 10 begins with providing the lower die 12 which has a plurality of bond pads 18 on a face side 22 of the lower die 12. A layer of dielectric shielding 20 is applied over the lower die face side 22. The leads 16 are adhered to an upper surface 24 of the shielding layer 20. Shielding layer 20 may preferably comprise a polyimide tape such as Kapton™ film or tape having a suitable adhesive on each side. Alternatively, it may comprise a liquid, gel or paste layer having adhesive characteristics for attachment of the dies and the leads of the lead frame. All of the foregoing options are known in the art. A plurality of lower die bond wires 26 are attached between the lower die bond pads 18 and an upper surface 28 of their respective leads 16.

Once the lower die bond wires 26 are attached, a second layer of dielectric shielding 30 is applied over the leads 16 and the portion of the lower bond wires 26 extending over the lead upper surfaces 28. A back side 32 of the upper die 14 is adhered to an upper surface 34 of the second shielding layer 30. Layer 30 may also comprise a polyimide, other suitable dielectric tape or film or other suitable material. A plurality of upper die bond wires 36 is attached between a plurality of bond pads 38 on a face side 40 of the upper die 14 and the upper surface 28 of their respective leads 16. A die coat may be applied to the face side of upper die 14 after wire bonding, if desired.

Preferably, the lower die bond wires 26 are attached using a low-loop-profile wirebonding technique such that the lower die bond wires 26 lay substantially flush to the lead upper surface 28.

The die assembly 10 may be encapsulated with plastic by transfer molding or other process known in the art, as shown in broken lines at 42, the outer ends of leads 16 extending to the exterior of the package.

Figure 2:
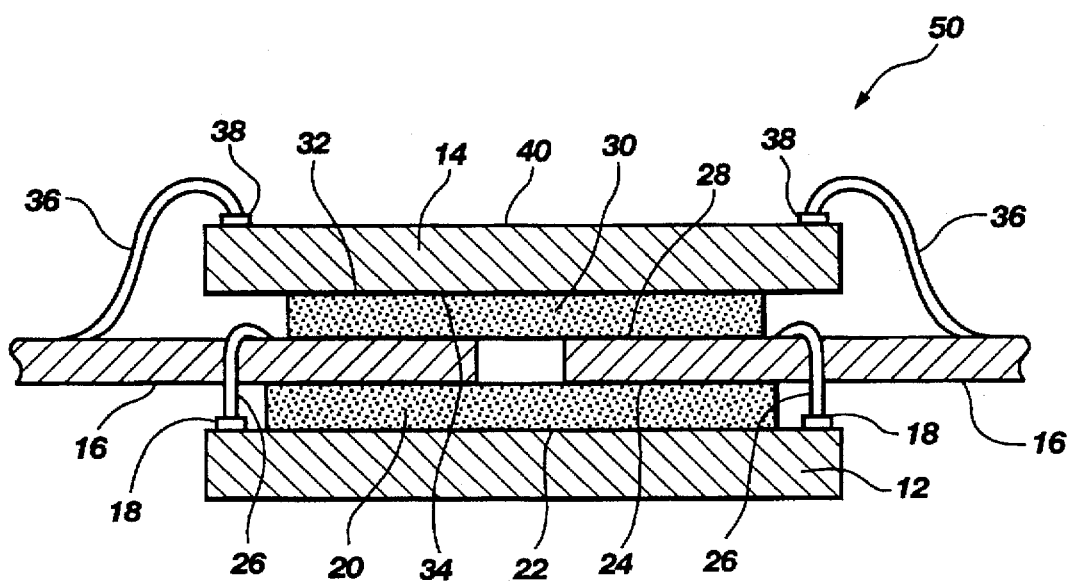
FIG. 2 is a side cross-sectional view of a second preferred assembly of the present invention.

FIG. 2 illustrates a second preferred bare die assembly 50 of the present invention. Components common to both FIG. 1 and FIG. 2 retain the same numeric designation. The assembly 50 is similar to the assembly 10 of FIG. 1 in that it comprises the lower die 12 and the superimposed upper die 14 with the plurality of leads 16 disposed therebetween. The lower die 12 has the plurality of bond pads 18 on the face side 22 of the lower die 12. The layer of shielding 20 is applied over the lower die face side 22. The leads 16 are adhered to the upper surface 24 of the shielding layer 20. The plurality of lower bond wires 26 is attached between the lower die bond pads 18 and the upper surface 28 of their respective leads 16.

Once the lower bond wires 26 are attached, the second layer of shielding 30 is applied over the leads 16. In this embodiment, the lower die bond wires are attached with a more vertical arrangement such that there is only a small portion of each of the lower die bond wires 26 extending over the lead upper surfaces 28. Alternately, the lower die bond wires 26 can be attached to the lead upper surface 28 in a direction which extends away from the assembly 50 (not shown). With either arrangement, no portion of the second shielding layer 30 covers the portion of the lower die bond wires 26 which extend over the lead upper surfaces 28.

The back side 32 of the upper die 14 is adhered to the upper surface 34 of the second shielding layer 30. The plurality of upper die bond wires 36 is attached between the plurality of bond pads 38 on the face side 40 of the upper die 14 and the upper surface 28 of their respective leads 16.

Figure 3:
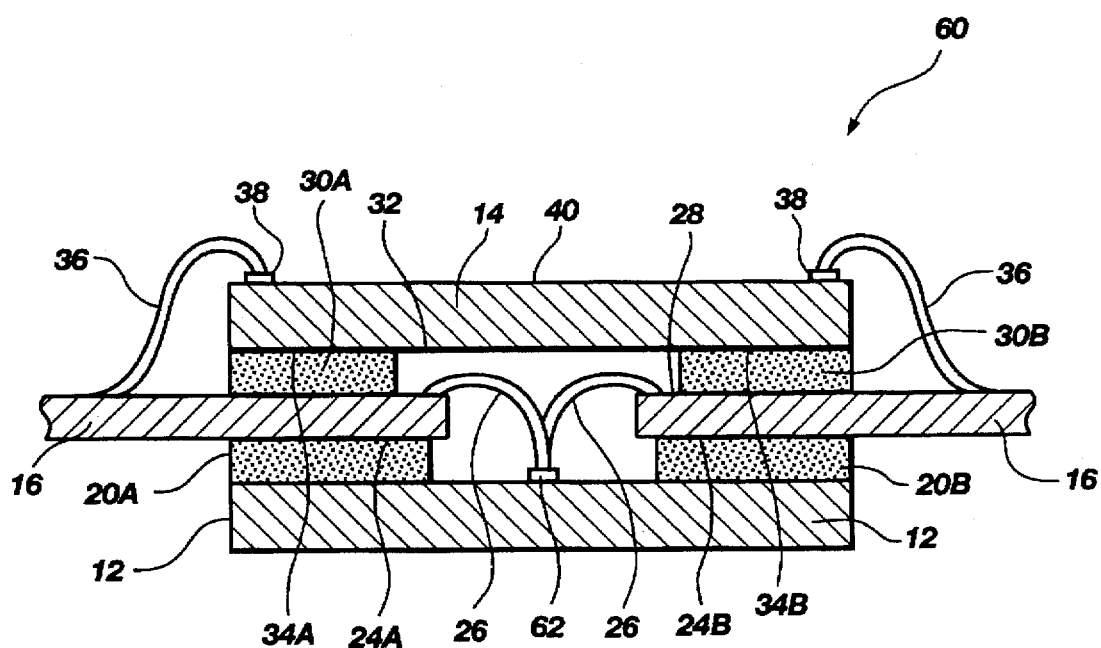
FIG. 3 is a side cross-sectional view of a third preferred assembly of the present invention.

FIG. 3 illustrates a third preferred bare die assembly 60 of the present invention. Components common to the previous figures and FIG. 3 retain the same numeric designation. The assembly 60 is similar to the assembly 10 of FIG. 1 in that it comprises the lower die 12 and the superimposed upper die 14 with the plurality of leads 16 disposed therebetween. However, the lower die 12 has a plurality of lower bond pads 62 in one or more rows in approximately the middle of the face side 22 of the lower die 12. Two parallel layers of dielectric shielding 20A and 20B are applied over the lower die face side 22 on either side of the row of lower bond pads 62. The leads 16 are adhered to the upper surfaces 24A and 24B of the shielding layers 20A and 20B, respectively. The plurality of lower die bond wires 26 is attached between the lower die bond pads 62 and the upper surface 28 of their associated, respective leads 16.

Once the lower die bond wires 26 are attached, a second set of parallel layers of dielectric shielding 30A and 30B are applied over the leads 16. In this embodiment, the lower die bond wires 26 may or may not be covered with the second shielding layers 30A or 30B. The back side 32 of the upper die 14 is adhered to the upper surfaces 34A and 34B of the second shielding layers 30A and 30B, respectively. A plurality of upper die bond wires 36 are attached between a plurality of bond pads 38 on a face side 40 of the upper die 14 and the upper surface 28 of their respective leads 16.

A conformal coating or poring material (not shown) may be disposed within the assembly 60 around the lower die bond wires 26. Alternately, a plastic encapsulation material (not shown) used to encapsulate the bare die assembly 60 is also injected into the bare die assembly 60 which acts to insulate the lower die bond wires 26.

Figure 4:
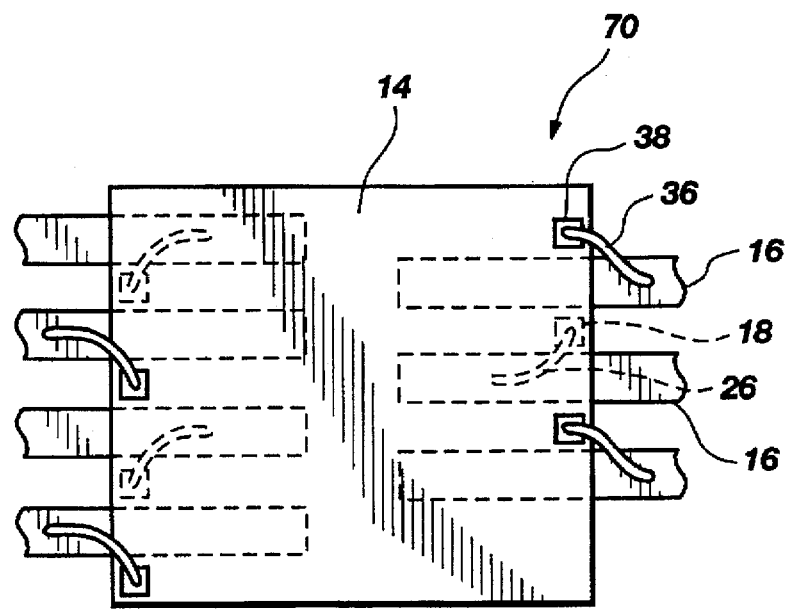
FIG. 4 is a top view of one lead arrangement suitable for use in the present invention.

FIG. 4 illustrates a top view of a bare die assembly 70 of the present invention showing one embodiment of a lead arrangement. Components common to the previous figures and FIG. 4 retain the same numeric designation. Assembly 70 may have the same structural assembly of FIGS. 1, 2 or 3 comprising leads 16 (shown partially hidden) of substantially the same length which are attached as discussed above. A bond pad configuration as employed in the assemblies of FIGS. 1 and 2 is depicted.

Figure 5:
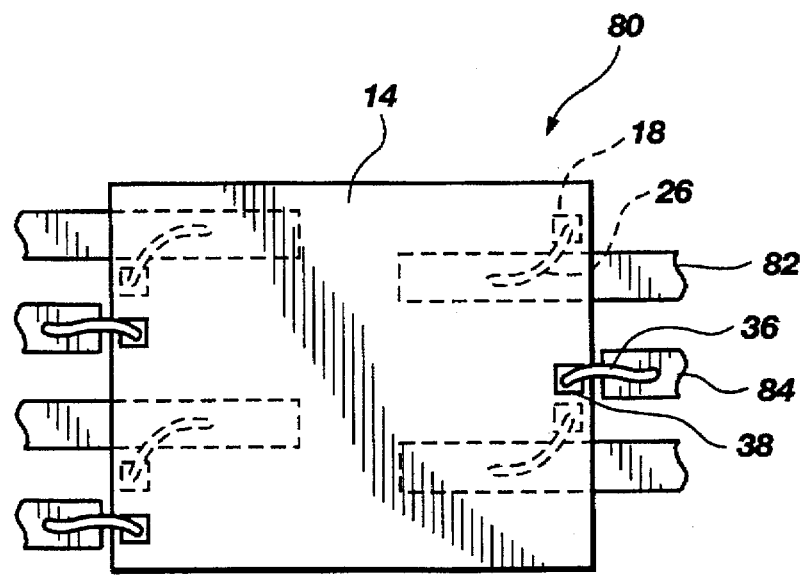
FIG. 5 is a top view of an alternate lead arrangement suitable for use in the present invention.

FIG. 5 illustrates a top view of a bare die assembly 80 of the present invention showing an alternate lead arrangement. Components common to the previous figures and FIG. 5 retain the same numeric designation. Assembly 80 may have the same structural assembly of FIGS. 1, 2 or 3 comprising leads of differing length. A plurality of extended leads 82 (shown partially in shadow) is dispersed along the length of the assembly 80 with an alternating plurality of truncated leads 84. The extended leads 82 extend between the upper die 14 and lower die 12 and are connected to the lower bond pads 18 (shown in shadow) by the lower die bond wires 26 (also shown in shadow). The truncated leads 84 preferably do not extend between the upper die 14 and lower die 12, but terminate adjacent the edge of the dies 12 and 14, respectively. The truncated leads 84 are connected to the upper bond pads 38 by the upper die bond wires 36. This arrangement assists in reducing the potential for shorting between bond wires and leads. The use of truncated leads 84 does not impair the structural stability of the assembly 80 because both dies are secured to the extended leads 82 and the entire assembly 80 is usually encased in an encapsulating material (not shown).

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A multi-die semiconductor die assembly, comprising:
   a plurality of leads, each lead of the plurality of leads having a first side and a second side thereof;
   a first dielectric layer of material secured to the first side of at least one lead of said plurality of leads;
   a second dielectric layer of material secured to the second side of at least on lead of said plurality of leads;
   a first die having a size, a face, and a back, with said face secured to at least one of said plurality of leads on the first side thereof by the first dielectric layer of material secured to the first side of at least one lead of said plurality of leads, the first dielectric layer of material located between at least a portion of said face and the at least one lead of said plurality of leads;
   a second die having a size substantially the same as the size of said first die, a face, and a back, with said back secured to at least one of said plurality of leads on the second side thereof opposite said first die by the second dielectric layer of material secured to the second side of at least one lead of said plurality of lead, the second dielectric layer of material located between at least a portion of said back and said plurality of leads;
   at least one conductor of a first plurality of conductors extending between said face of said first die and at least one lead of said plurality of leads on the second side of said plurality of leads; and
   at least one conductor of a second plurality of conductors extending said face of said second die and at least one lead of said leads on said second side of said plurality of leads.

2. The assembly of claim 1, wherein at least said first plurality of conductors comprises bond wires.

3. The assembly of claim 2, wherein the extent of said bond wires to said plurality of lead lines between said second die and said plurality of leads.

4. The assembly of claim 2, wherein said second dielectric layer between said second die back and said plurality of leads overlies said extent of as least one of said bond wires.

5. The assembly of claim 4, wherein said second dielectric layer contacts a portion of said lead extent of said at least one of said bond wires.

6. The assembly of claim 2, wherein said bond wires extend substantially vertically from said face of said first die to said plurality of leads.

7. The assembly of claim 2, wherein the path of at least one of said bond wires from said first die face to said plurality of said leads lies substantially under said second die.

8. The assembly of claim 2, wherein said first die and said second die lie in substantially parallel planes and are superimposed, and the path of said bond wires from said first die face to said plurality of leads lies substantially within an area defined by said superimposition of said first die and said second die.

9. The assembly of claim 2, wherein at least one of said bond wires extends from an interior location on said firs die face to one of said plurality of leads, and said second dielectric layer between said second die and said plurality of leads lies to the side of the path of said at least one bond wore but does not extend thereover.

10. The assembly of claim 1, wherein a first number of said plurality of leads extend between said first die and second die, and a second number of said plurality of leads lie adjacent to said first die and said second die but do not extend therebetween.

11. The assembly of claim 10, wherein said first plurality of conductors extend to said plurality of lead extending between said first die and said second die, and said second plurality of conductors extend to adjacent leads of said plurality of leads.

12. The assembly of claim 1, wherein said first die and said second die lie in substantially paralleled planes in at least partially superimposed relation, and said plurality of leads comprise a lead frame with two sets of substantially co-parallel but opposing leads extending toward each other from opposing sides of said first die and said second die.

13. The assembly of claim 12, wherein said first plurality of conductors and said second plurality of conductors comprise bond wires.

14. The assembly of claim 13, wherein said first plurality of conductors are located substantially within the region of superimposition of said dice.

15. The assembly of claim 13, wherein some of said plurality of leads extend between said first die and said second die, and others of said plurality of leads are truncated and terminate outside the periphery of at least one of said first die and said second die.

16. The assembly of claim 15, wherein said first conductors are attached to said some of said plurality of leads extending between said first die and said second die, and said second plurality of conductors are attached to said others of said plurality of leads which are truncated and terminate outside the periphery of at least one of said first die and said second die.

17. A method of fabricating a multi-die semiconductor die assembly, comprising:

providing a first die having a size, a face, and a back and a second die having a size substantially the same as the size of said first die, a face, and a back;

providing a substantially planar lead frame including a plurality of leads, each lead of said plurality of leads having a first side and a second side;

securing said face of said first die to at least some of said plurality of leads with a first dielectric layer disposed between at least a portion of said first die face and the first side of at least one lead of said plurality of leads;

wire bonding conductors between said first die face and at least some of said plurality of leads with said conductors affixed to the second side of at least one lead of said plurality of leads, the second side of the at least one lead being located on the side of said lead frame opposite said first die;

securing said back of said second die to at least some of said plurality of leads on the second side of at least one lead of said plurality of leads of said lead frame opposite that to which said first side is secured with a dielectric layer disposed between at least a portion of said second die back and at least one lead of said plurality of leads; and wire bonding conductors between said second die face and at least some of said plurality of leads with said conductors affixed to the second side of at least on lead of said plurality of leads the second side of the at least one lead of said plurality of leads being located on the second-die side of said lead frame.

18. The method of claim 17, further comprising disposing said dielectric layer over at least some of said first die-to-leads conductors.

19. The method of claim 17, further comprising disposing said dielectric layer adjacent but not over at least some of said first die-to-leads conductors.

20. The method of claim 17, further comprising wire bonding at least some of said first die-to-leads conductors between the interior of said first die face and said plurality of leads.

21. The method of claim 20, wherein said dielectric layer between said second die back and said plurality of leads lies to one side of the locations wherein at least some of said first conductors are attached to said plurality of leads.

* * * * *

UNITED STATES PATENT AND TRADEMARK OFFICE
CERTIFICATE OF CORRECTION

PATENT NO. : 5,689,135
DATED : November 18, 1997
INVENTOR(S) : Ball

It is certified that error appears in the above-identified patent and that said Letters Patent is hereby corrected as shown below:

Title page, item [56]"U.S. Patents" change "Pansby" to --Pashby--

In column 1, line 41, change "5,012,325" to --5,012,323--

In column 1, line 48, change "mated" to --coated--

In column 2, line 39, change "coveting" to --covering--

In column 2, line 45, change "LOG" to --LOC--

In column 5, line 38, change "poring" to --potting--

In column 6, line 22, change "on" to --one--

In column 6, line 54, change "as" to --at--

In column 7, line 5, change "firs" to --first--

In column 7, line 9, change "wore" to --wire--

In column 7, line 21, change "paralleled" to --parallel--

In column 8, line 26, change "on" to --one--

Signed and Sealed this

Twenty-seventh Day of October, 1998

Attest:

BRUCE LEHMAN

*Attesting Officer*  *Commissioner of Patents and Trademarks*